(12) United States Patent
Leroux et al.

(10) Patent No.: US 7,054,007 B2
(45) Date of Patent: May 30, 2006

(54) CALIBRATION WAFER FOR A STEPPER

(75) Inventors: Pierre Leroux, San Antonio, TX (US); David H. Ziger, San Antonio, TX (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 537 days.

(21) Appl. No.: 10/245,239

(22) Filed: Sep. 16, 2002

(65) Prior Publication Data

US 2003/0152848 A1 Aug. 14, 2003

Related U.S. Application Data

(60) Provisional application No. 60/355,203, filed on Feb. 8, 2002.

(51) Int. Cl.
- G01B 11/00 (2006.01)
- G01R 31/26 (2006.01)
- H01L 21/76 (2006.01)
- G03F 9/00 (2006.01)
- G03B 27/42 (2006.01)

(52) U.S. Cl. .......................... 356/401; 438/14; 438/16; 438/401; 430/22; 355/53; 355/77

(58) Field of Classification Search ........ 356/399–401; 250/548; 430/5, 22, 30; 355/53, 55, 77; 438/401; 257/797

See application file for complete search history.

(56) References Cited

U.S. PATENT DOCUMENTS

| 6,258,611 B1 | 7/2001 | Leroux |
| 6,716,649 B1 * | 4/2004 | Ziger .......................... 438/14 |

OTHER PUBLICATIONS

U.S. Appl. No. 09/826,839, filed Apr. 6, 2001, David Ziger.
U.S. Appl. No. 10/117,924, filed Apr. 5, 2002, David Ziger.
U.S. Appl. No. 09/422,914, filed Oct. 21, 1999, Pierre Leroux.
U.S. Appl. No. 09/422,909, filed Oct. 21, 1999, Pierre Leroux.

* cited by examiner

Primary Examiner—Layla G. Lauchman
Assistant Examiner—Gordon J. Stock, Jr.
(74) Attorney, Agent, or Firm—Peter Zawilski

(57) ABSTRACT

There is a method for manufacturing wafers. In an example embodiment, the method employs a stepper with a reticle, lens, and stage movement parameters that comprise providing a set of intentionally-misaligned calibration wafers with predetermined input corrections, the input corrections accounting for linearity of response and interactions between the reticle, lens and stage movement parameters of the stepper. The stepper is calibrated by using the predetermined input corrections from the set of intentionally misaligned calibration wafers. Using the calibrated stepper, aligned patterns on the wafers are printed.

7 Claims, 6 Drawing Sheets

CALIBRATION WAFER FOR A STEPPER

PRIORITY OF EARLIER APPLICATIONS

This application claims priority of provisional patent application titled, "Calibration Wafer for a Stepper," (Ser. No. 60/355,203) filed on Feb. 8, 2002 and is incorporated by reference in its entirety.

FIELD OF THE INVENTION

The present claimed invention relates to the field of semiconductor wafer fabrication. More specifically, the present claimed invention relates to an apparatus and method for correcting misalignment between patterned layers during wafer stepping.

BACKGROUND

The ongoing drive to miniaturize integrated circuits would be futile without the commensurate ability to image finer features onto prior patterns within proportionately smaller tolerances. Consequently, methods to improve alignment accuracy continue to be of primary importance both in the introduction of new and yield improvement of existing technologies.

Refining overlay measurements has been an important part of reducing overlay budgets because engineers can only improve what can be accurately measured. Measurability has been improved by refining hardware, edge detection and calibration algorithms predominately using visible light though other techniques have been studied. Many process layers such as shallow trench isolation (STI) and copper dual damascene require target optimization to improve readability and/or reduce asymmetry in the printed targets.

Significant advances towards improving overlay have occurred because stepper manufacturers have continually improved stage movement reproducibility. In addition, current exposure tools provide the user with parameters, commonly called "correctables," that can compensate stage movement, and lens and reticle placement to optimize alignment onto prior layers. Various steppers implement different, though usually related, sets of correctable offsets. Methods for modeling these parameters have become important to minimize misalignment across stepper fields and wafers.

In striving to optimize inter-layer alignment, each of the error-causing variables can be corrected by a different part of the stepper. If errors are not segregated and measured independently, then the error measurements are confounded and the resulting corrections for each variable may be contradictory and self-defeating. A number of parameters have to be accounted for in preparing the wafer stepper to print patterns on the substrates with minimal error. Refer to Table 1.

There are a number of techniques for improving alignment accuracy of particular wafer stepper parameters. In a prior art process, described in U.S. Pat. No. 6,258,611 B1 (issued Jul. 10, 2001), titled, "Method for Determining Translation Portion of Misalignment Error in a Stepper," herein incorporated by reference in its entirety, there is a method for determining the translation portion ($R_{x0}$, $R_{y0}$) of misalignment error in a stepper. In an example embodiment, the method comprises a series of steps in a stepper, starting with the step of receiving a wafer in the stepper. In another step a first pattern, including an error-free fine alignment target, is created on the wafer. Next, the wafer is realigned in the stepper using the error-free alignment target. Then a second pattern is created on the wafer overlaying the first pattern. In another step, the translation error between the first pattern and second pattern is measured.

In another prior art process, described in U.S. patent application Ser. No. 09/422,909 (filed on Oct. 21, 1999) titled, "Method for Determining Rotational Error Portion of Total Misalignment Error in a Stepper," herein incorporated by reference in its entirety, there is a method for determining the rotational error portion of ($R_{ChipRot}$, $R_{xWafRot}$, $R_{yWafRot}$) total misalignment error in a stepper. In an example embodiment, the method comprises a series of steps in a stepper, starting with the step of receiving a wafer, having a first pattern and an error-free fine alignment target, in the stepper. In another step, the wafer is aligned in the stepper using the error-free alignment target. A second pattern is created on the wafer overlaying the first pattern. In another step, the rotational error portion of the total misalignment error is determined by measuring the circumferential misalignment between the first pattern and the second pattern.

In yet another prior art process, described in U.S. patent application Ser. No. 09/422,914 (filed on Oct. 21, 1999) titled, "Method for Determining Magnification Error Portion of Total Misalignment Error in a Stepper," herein incorporated by reference in it entirety, there is a method for determining he magnification error portion ($R_{ChipMag}$, $R_{xWafMag}$, $R_{yWafMag}$) of total misalignment error in a stepper. In an example embodiment, the method comprise a series of steps in a stepper, starting with the step of receiving a wafer, having a first pattern and an error-free alignment target, in the stepper. In another step, the wafer is aligned in the stepper using the error-free fine alignment target. A second pattern is created on the wafer overlaying the first pattern. In another step, the magnification error portion of the total misalignment error is determined by measuring the radial misalignment between the first pattern and the second pattern.

In any of the three processes described above, distortion-free calibration wafers are prepared. In an example process, wafers, upon which photo resist is applied, are loaded into a stepper. The stepper is adjusted to reduce scaling and orthogonality on bare silicon wafers to less than 0.1 ppm. The center die (5.247 mm×5.247 mm) of a 5×5 chip test reticle is stepped across the entire wafer by adjusting the aperture blades. This center die is projected by the center location of the stepper lens. The lens center has minimal distortion. This stepping distance is chosen since 5×5 die match the same reticle opened to full field and stepped at 26.35 mm×26.235 mm increments. The wafers are developed and the patterns are lightly etched into the silicon. The calibration wafers have a first layer pattern that is free of lens distortions. Each sub-field has contains the required marks to align a second layer pattern to it. Refer to FIG. 1A Having made the calibration wafers with an error-free first layer, a second layer, as shown in FIG. 1B, is printed on the calibration wafer as a full shot, the entire reticle plate projected through the full aperture of the stepper lens. The errors may be calculated from the positions of the artifacts printed on the second layer relative to the positions of the distortion-free artifacts printed and etched onto the first layer.

The above method enables one to measure components of alignment when aligning to a perfect grid. There exists a need for structures that have calibrated offsets from perfect grids so that responses to misalignment can be measured.

SUMMARY OF THE INVENTION

The present invention is directed toward the making of an apparatus for the measuring of misalignment between layers printed on a semiconductor substrate. In an example embodiment, in a wafer stepper, there is a method for manufacturing a calibration alignment substrate. The method comprises receiving the substrate in the stepper. A pattern of error-free alignment artifacts is printed on the substrate. Then, a second pattern of alignment artifacts having predetermined errors is printed on the substrate. The first and second patterns of alignment artifacts are then etched into the substrate. A feature of this embodiment, is that the predetermined errors are selected from at least one of the following, translation error, die magnification, die rotation, wafer magnification, and wafer rotation. Another feature of this embodiment is that the second pattern of alignment artifacts is printed with a predetermined offset. The predetermined offset may be selected to minimize round-off error for a wafer stepper having a defined incremental shift value.

In another example embodiment, there is a method for determining correctable parameters on a wafer stepper, the method employing a stepper with a reticle, lens and stage movement parameters comprising the steps of receiving a substrate into the stepper. Next, a pattern of error-free alignment artifacts is printed on the substrate. A second pattern of alignment artifacts having predetermined errors is then printed on the substrate. The first and second patterns of the alignment artifacts are etched into the substrate. A third pattern of alignment artifacts is aligned to the first or second pattern alignment artifacts and the third pattern of alignment artifacts is printed. The resulting alignment of the third pattern to the first and second patterns is measured. A feature of this embodiment is that the second pattern of alignment artifacts has a predetermined offset selected to minimize round-off error for a wafer stepper having a defined incremental shift value.

In yet another example embodiment, there is a method for manufacturing wafers. The method employs a stepper with a reticle, lens, and stage movement parameters that comprise providing a set of intentionally-misaligned calibration wafers with predetermined input corrections, the input corrections accounting for linearity of response and interactions between the reticle, lens and stage movement parameters of the stepper. The stepper is calibrated by using the predetermined input corrections from the set of intentionally misaligned calibration wafers. Using the calibrated stepper, aligned patterns on the wafers are printed.

In yet another example embodiment, there is a calibration substrate used in conjunction with a wafer stepper with reticle, lens and stage movement parameters, the calibration substrate comprises a first pattern of error-free alignment artifacts on the substrate and a second pattern of alignment artifacts having predetermined errors on the substrate. A feature of this embodiment is that the second pattern of alignment artifacts has a predetermined offset selected to minimize round-off error for a wafer stepper having a defined incremental shift value of the reticle, lens, and stage movement parameters.

Additional advantages and novel features will be set forth in the description which follows, and in part may become apparent to those skilled in the art upon examination of the following, or may be learned by practice of the invention.

BRIEF DESCRIPTION OF THE DRAWINGS

The invention is explained in further details, by way of examples, and with reference to the accompanying drawing wherein.

DETAILED DESCRIPTION

Figure 1A:
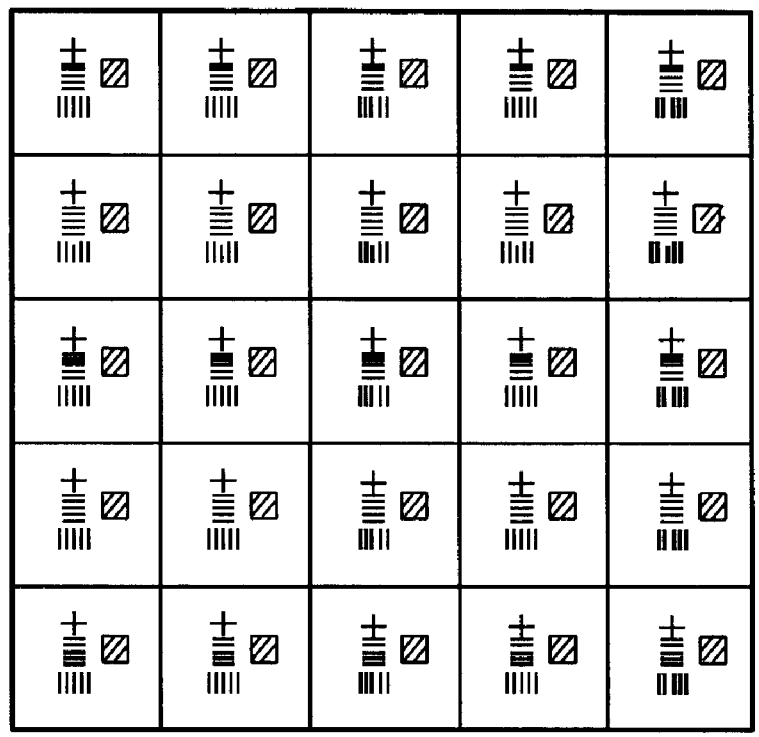
FIG. 1A depicts the pattern printed as the first layer on a calibration wafer.
Figure 1B:
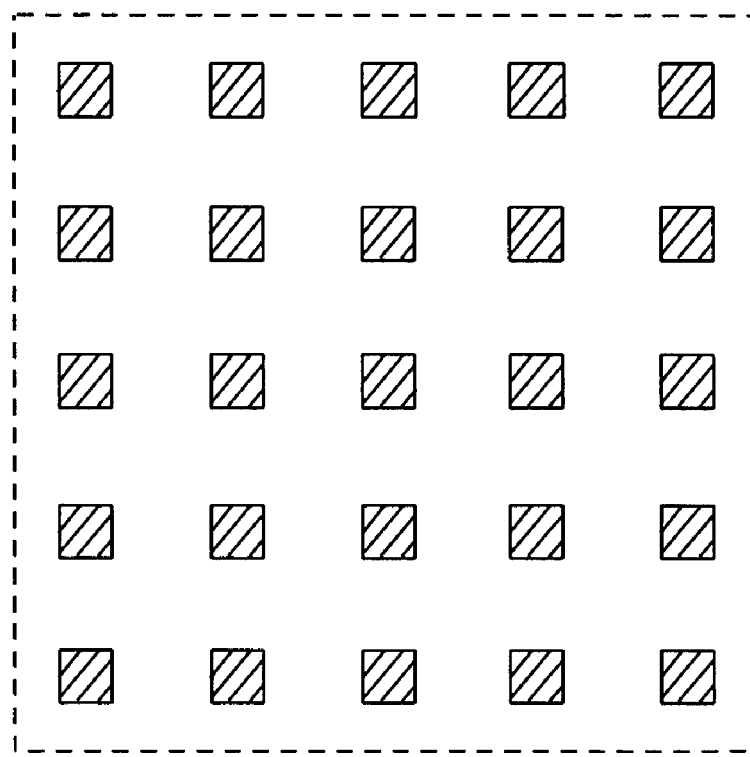
FIG. 1B depicts the second pattern to be aligned to the pattern of FIG. 1A.

While there has been significant work towards modeling overlay data, an overlooked subject has been to quantify the effect of inputting correctables on alignment. For example, depending on conventions used for a particular stepper or lithographic layer, engineers know to input the measured parameter or to reverse the sign. From heuristics, certain parameters may be halved or multiplied or even compensated by another parameter when input. Herein incorporated by reference in their entirety, are pending applications, both titled, "Method to Improve Alignment by Response Analysis" (application Ser. No. 09/826,839) filed on Apr. 6, 2001 and continuation-in-part application (application Ser. No. 10/117,924) filed on Apr. 5, 2002 of David H. Ziger. In these applications, an algorithm for correcting misalignment between layers is introduced which is capable of compensating for interdependencies and arbitrary conventions of correctable factors. Corrections are determined from solving a set of linear equations that negate the effect of observed misalignment.

A simple linear model can adequately describe misalignment over a wafer and field. For a Canon EX4, a reasonable model to try is given by Equations 1a and 1b:

$$R_x = R_{x0} + R_{xChipMag} x_{chip} + R_{xChipRot} x_{chip} + R_{xWMag} x_{wafer} + R_{yWRot} x_{wafer} \tag{1a}$$

$$R_y = R_{y0} + R_{yChipMag} y_{chip} + R_{yChipRot} y_{chip} + R_{yWMag} y_{wafer} + R_{xWRot} y_{wafer} \tag{1b}$$

of which $R_x$ and $R_y$ are misalignment in the horizontal in vertical directions and the definitions for the first order coefficients are given in Table 1. Let the corresponding set of first order corrections that can be input into a stepper be represented by $X^{input}$. For example, the set of easily input corrections for Canon EX4 steppers is given by:

$$X^{input} = \begin{pmatrix} R_{x0} \\ R_{y0} \\ R_{ChipMag} \\ R_{ChipRot} \\ R_{xWMag} \\ R_{yWMag} \\ R_{xWRot} \\ R_{yWRot} \end{pmatrix}^{input} \quad (2)$$

Furthermore, assume that the components of alignment resulting from inputting $X^{input}$ is $X^{result}$:

$$X^{result} = \begin{pmatrix} R_{x0} \\ R_{y0} \\ R_{ChipMag} \\ R_{ChipRot} \\ R_{xWMag} \\ R_{yWMag} \\ R_{xWRot} \\ R_{yWRot} \end{pmatrix}^{result} \quad (3)$$

The user of the alignment apparatus can construct a transformation matrix T such that:

$$X^{result} = TX^{input} \quad (4)$$

Note that T is the identity matrix for the ideal case in which all correction inputs exactly match the results. Off-diagonal elements denote interactions between different correctable components. Diagonal elements that vary from unity quantify responses that differ in sign and/or magnitude from their input. In this formalism, the desired input vector that zeroes out the regressed components of misalignment is given by:

$$X^{input} = -T^{-1}X^{result} \quad (5)$$

Therefore, once T is determined, the vector of input corrections can be generally determined provided that its inverse exists. A method for determining T is to intentionally misalign a set of calibration wafers with predetermined input corrections and regress their effect on the resulting alignment components. Series of calibration wafers are exposed with a set of balanced offsets according to a design of experiments methodology and resulting alignment components are extracted from each wafer. Consider the correctables outlined in Table 1. To determine the elements of T, which affect each alignment component, a minimum of 8 independent input conditions are required. As an example, the row of T affecting $R_{yWafRot}$ can be found from regressing the set of equations of the form shown in Eq. 6 where i denotes the $i^{th}$ characterization condition:

$$R_{yWafRot}^{result\ i} = R_{x0}^{input\ i}T_{8,1} + R_{y0}^{input\ i}T_{8,2} + R_{ChipMag}^{input\ i}T_{8,3} + \quad (6)$$
$$R_{ChipRot}^{input\ i}T_{8,4} + R_{xWafMag}^{input\ i}T_{8,5} + R_{yWafMag}^{input\ i}T_{8,6} +$$
$$R_{xWafRot}^{input\ i}T_{8,7} + R_{yWafRot}^{input\ i}T_{8,8}$$

Once the components of T are found, other effects can be easily considered. For example, if the calibration wafers print a frame into an existing outer frame but specific layers or technologies do the opposite (perhaps due to different design rules), then this can be accounted for by reversing the sign of the correction vector. The table below defines the Input Correctables for a CANON EX4™ Stepper.

TABLE 1

Input Correctables for Canon EX4 Steppers

| Component | Symbol | Definition |
|---|---|---|
| x, y Translation Error | $R_{x0}$, $R_{y0}$ | Zeroith order misalignment, normally calculated from the average misalignment |
| Average Chip Magnification | $R_{ChipMag}$ | $Av\left(\frac{\partial R_x}{\partial x_{Chip}}, \frac{\partial R_y}{\partial y_{Chip}}\right)$ |
| Average Chip Rotation | $R_{ChipRot}$ | $Av\left(\frac{\partial R_x}{\partial y_{Chip}}, \frac{\partial R_y}{\partial x_{Chip}}\right)$ |
| x Wafer Magnification | $R_{xWafMag}$ | $\frac{\partial R_x}{\partial x_{Wafer}}$ |
| y Wafer Magnification | $R_{yWafMag}$ | $\frac{\partial R_y}{\partial y_{Wafer}}$ |
| x Wafer Rotation | $R_{xWafRot}$ | $\frac{\partial R_y}{\partial x_{Wafer}}$ |
| y Wafer Rotation | $R_{yWafRot}$ | $\frac{\partial R_x}{\partial y_{Wafer}}$ |

Figure 2:
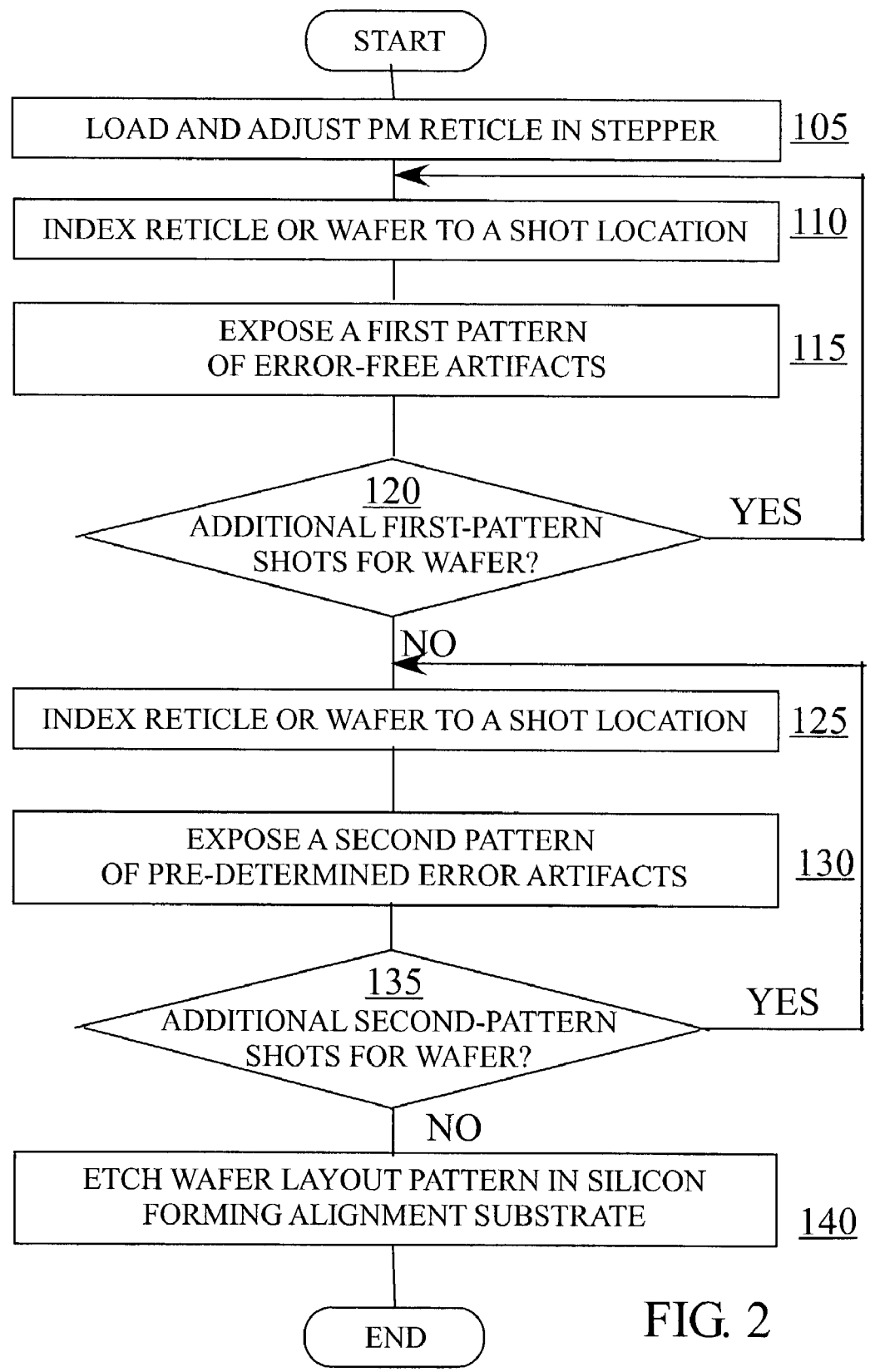
FIG. 2 shows the steps in manufacturing an alignment substrate in accordance with an embodiment of the present invention.

The present invention of fabricating a calibration substrate and using the calibration substrate enables the user to solve the afore-mentioned equations whose solution determines the input correctables needed to minimize error. In a wafer stepper apparatus, a calibration wafer is made according to an embodiment of the present invention. Refer to FIG. 2. In a process 100, a PM ("Preventive Maintenance") reticle is loaded and adjusted in a stepper 105. A wafer substrate (having been coated with photo resist) is loaded into the stepper as well and the reticle or wafer is indexed to a shot location 110. The wafer is first coated with a photo resist. A first pattern of error-free targets is exposed 115. These targets enable the wafer stepper to align subsequent printed layers with those previously printed. Additional patterns, as required to perform measurements may be shot after the first-pattern shots 120.

The reticle or wafer is re-indexed to another shot location 125. A second pattern comprising pre-determined error targets is shot. 130. By adjustment of the wafer stepper, these predetermined error targets are deliberately printed to deviate from those that are unshifted. Additional second patterns, as required may be shot 135. After the first and second patterns have been exposed onto the photo resist, the wafer layout pattern is etched 140. The result is a calibration wafer substrate having unshifted sites and those sites having predetermined deliberate errors.

Figure 3:
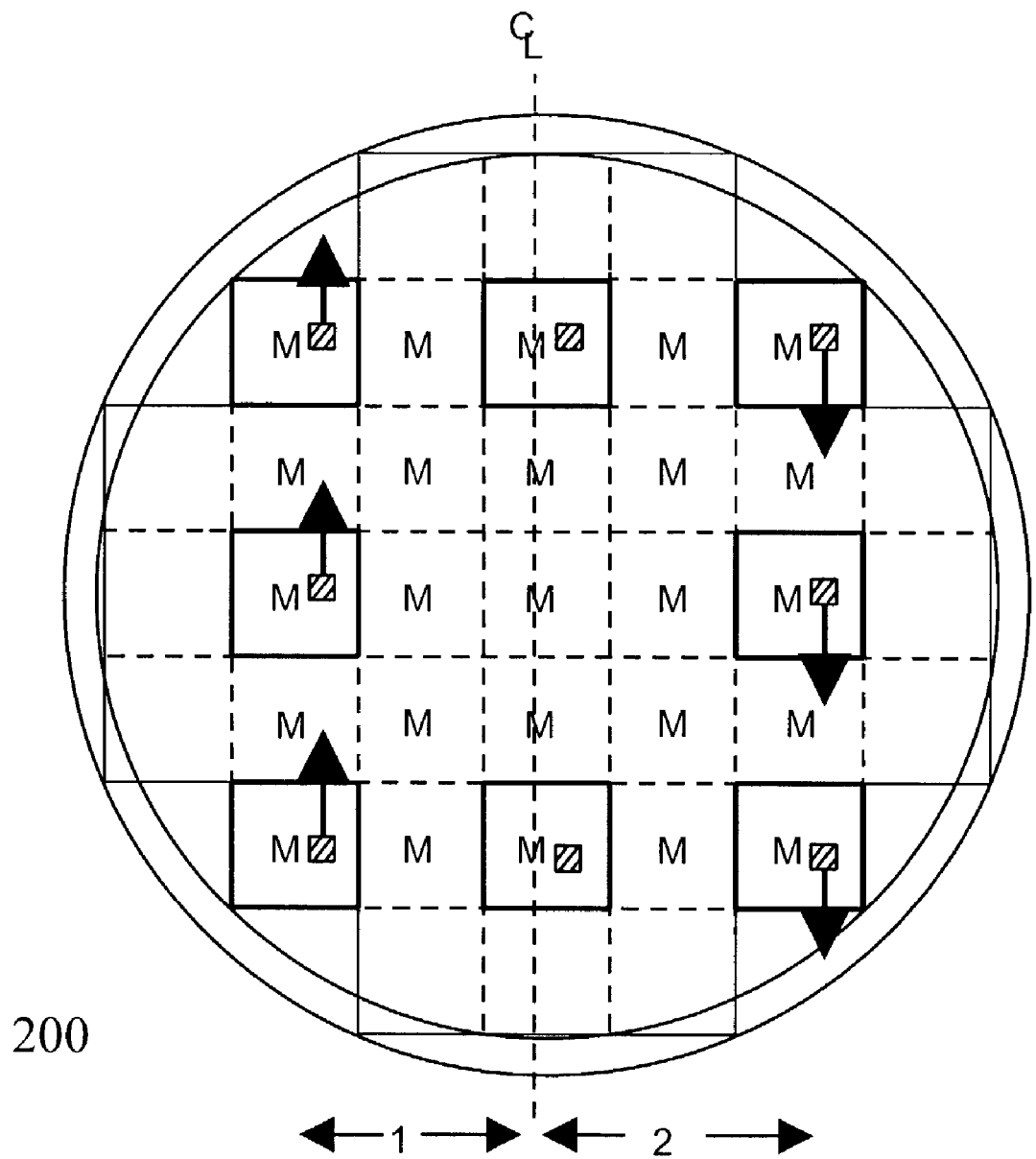
FIG. 3 is an example wafer comprising x-wafer offset having been fabricated according to an embodiment of the present invention.

Refer to FIG. 3. An alignment substrate 200, usually a silicon wafer, has been fabricated with the process outlined in FIG. 2. A second masking layer is alignable to patterns with known offsets and measurable against unshifted die. For example, FIG. 3 shows how die are shiftable to cause a clockwise (−) x wafer rotation and measured against unshifted die (designated by M). The die denoted by arrows, comprise an x-wafer offset. If the second masking layer is aligned to these eight die and measured at the unshifted "M" sites, the effect of the wafer offset can be quantified. Along the rotation axis (x), the shifted die are three distances from the wafer center. The die near the center require a negligible shift since their distance from the x-centerline ($C_L$) is small. Die at (1) require a somewhat small shift than (2) since they are closer to the center axis. In a similar fashion, a clockwise (+) x wafer rotation is created by reversing the direction of the shifted die. Indeed, all other wafer and chip offsets are created by properly shifting selected die.

Figure 4:
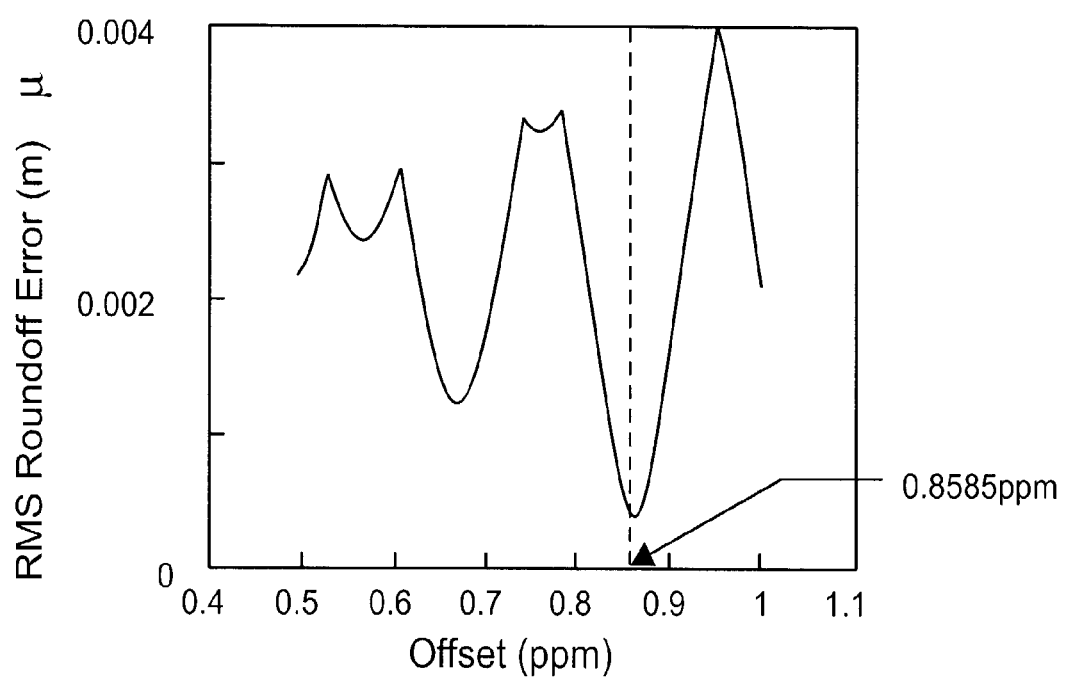
FIG. 4 illustrates the minimization of round-off error in selecting appropriate offsets for an example wafer stepper.

Though in principal any offset can be created by shifting the particular die by a determined amount, the EX4 software allows shift inputs in discrete increments of 0.01 μm which can cause a round-off error. This minimum increment is usually due the limitation of the mechanical elements of the wafer stepper (e.g., the wafer or reticle stages). There are two ways of minimizing round-off error. First is to choose sites based on symmetry as to minimize the number of discrete shifts. In the case shown in FIG. 3, the shifted sites are basically two different distances from the centerline of the wafer since die near the X-axis centerline require an insignificant shifting. Second, the offsets can be chosen as to minimize the round-off error. Table 2 and FIG. 4 show that ±0.8585 ppm offsets minimize the sum of the squares of the round-off error for the specific case of shifting a 5.247 mm×5.247 mm die one site removed of center of the 5×5 field and two full fields from the center of the wafer (i.e. the case shown in FIG. 3). Ideally, to create wafer offsets of ±0.8585 ppm with 5.247 mm×5.247 mm die, shifts of ±0.0405 μm and ±0.0496 μm are required at the fields shown in FIG. 3. Rounding to ±0.04 μm and ±0.05 μm respectively cause a negligible error to uniformity of the resulting printed offset.

TABLE 2

Resulting Error from Different Offsets

| | Round-Off Error | | % Error | |
|---|---|---|---|---|
| Shift | Left of Center | Right of Center | Left of Center | Right of Center |
| 0.8000 | 0.004 | 0.002 | 7 | 4 |
| 0.8585 | 0 | 0.001 | 0 | 2 |
| 0.9000 | 0.002 | 0.003 | 4 | 5 |
| 0.9500 | 0.005 | 0.005 | 9 | 9 |

As shown in Table 2, if a different offset is used the resulting round-off error is increased. Refer to FIG. 4. If a given shift is used, the round-off errors arise at the fields shifted to the left of center (col. 2) and right of center (col.3) of the centerline (CL). The percentage error is shown in columns 4 and 5. For example, if a shift of 0.9500 is used, there is an inherent 9% error in the calibration standards for the specific case of shifting 5.247 mm×5.247 mm die one site removed from the center owing to round-off error, assuming a minimum 0.01 μm stepping resolution of the Canon I14/EX4 stepper. This approach in minimizing round-off error may be generalized to other wafer steppers with their particular stepping resolutions, as well.

Figure 5:
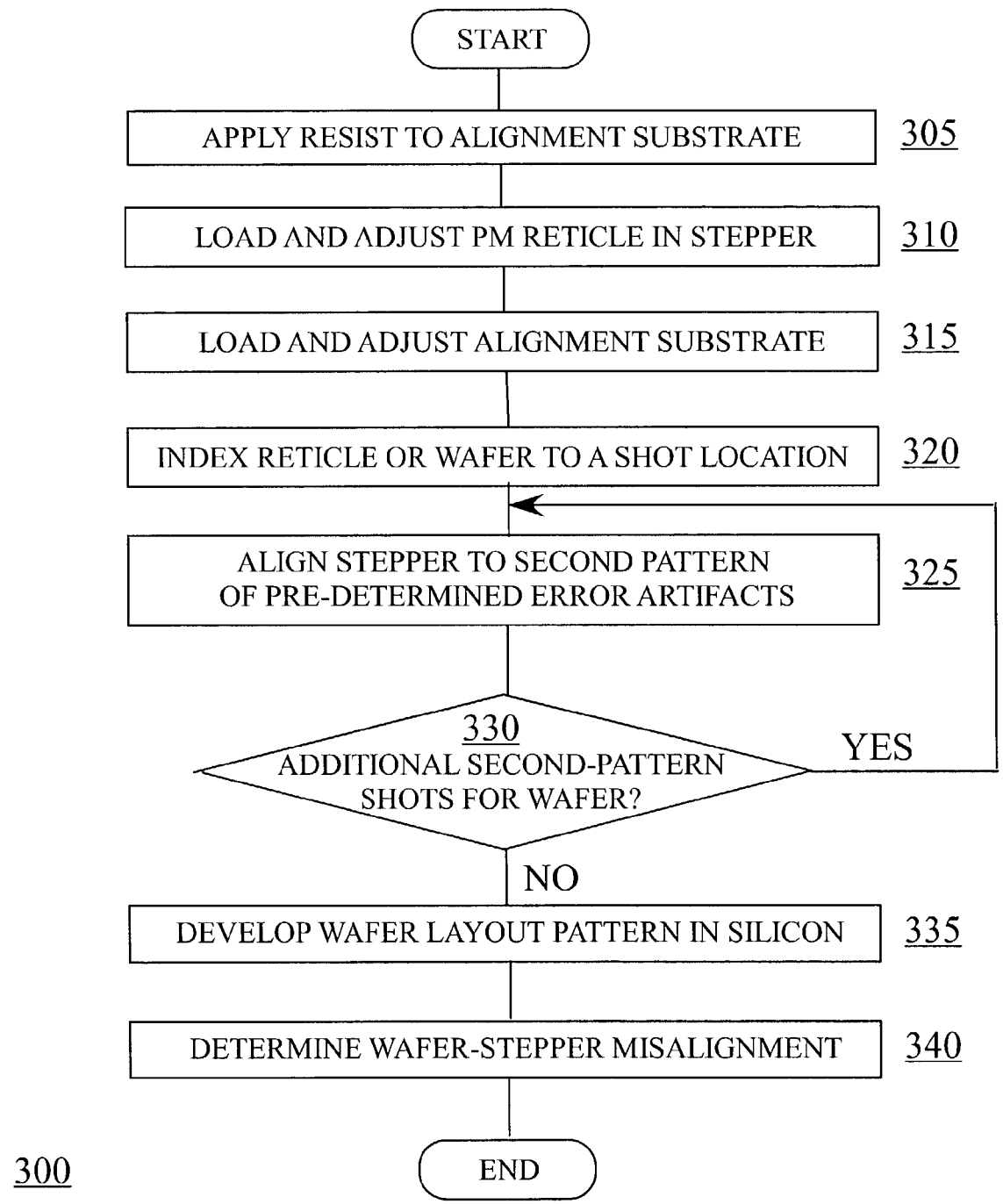
FIG. 5 shows the steps in using the alignment substrate to determine wafer-stepper errors in accordance with another embodiment of the present invention.

Refer to FIG. 5. The wafer substrate as illustrated in FIG. 3 that had been made following the steps outlined in FIG. 2 may flow be used to collect data for measurement of the parameters mentioned. The wafer substrate undergoes a process 300. Photo resist is applied to the alignment substrate 305. The PM reticle is loaded into the wafer stepper and adjusted 310. The alignment substrate is loaded into the wafer stepper and adjusted 315. The reticle or alignment substrate is indexed to a shot location 320. The stepper is aligned to a second pattern of pre-determined error artifacts 325. Additional shots are made as required 330. The photo resist is developed to render the wafer layout pattern in the silicon 335. The user then measures the wafer-stepper misalignment 340 between the developed pattern and the underlying alignment marks previously etched into the alignment substrate 200.

Figure 6:
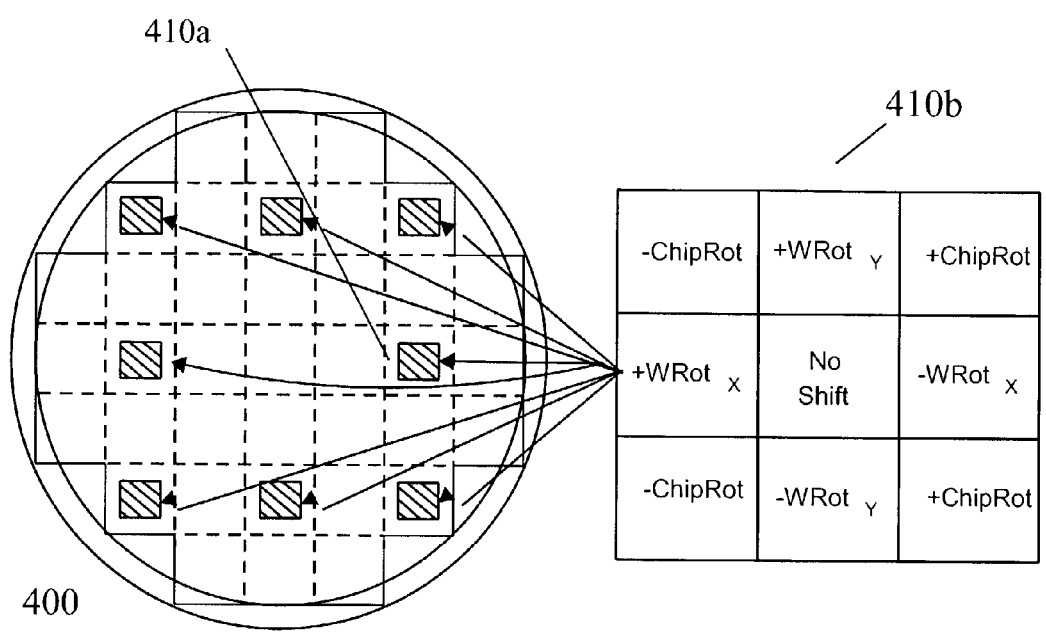
FIG. 6 shows the arrangement of shifted die in accordance with an embodiment of the present invention.

FIG. 6 shows the arrangement of the shifted die used to compose artifact wafers with ±0.8585 ppm x and y wafer rotation, according to an embodiment of the present invention. In an example analysis, twelve bare silicon wafers were stepped with this pattern with DUV lithography. They underwent a 500 Å silicon etch, then the photo resist was stripped. The eight highlighted full fields shown in FIG. 3 were used for fine alignment. Four Stepper jobs were written to align to die that created ±0.8585 ppm x and y wafer rotation as shown in FIG. 6. An artifact wafer 400 with eight highlighted full fields 410a is shown. Within full field 410a, patterns 410b to show the types of rotational mis-alignment contributions, (e.g., wafer rotation and chip rotation). A fifth stepper job was created to align to the center of the field that was unshifted to serve as a control. Two wafers each were exposed with each stepper job. After stepping and developing, these 12 wafers were measured at the sites marked marked "M" in FIG. 3. None of these sites were shifted at first mask and are at the center of the field for the second masking. Consequently, the effect of aligning to the shifted die could be quantified against an ideal, distortion free grid.

While the invention has been described particularly with respect to substrates comprising semiconductor wafers, it is possible to apply the invention to other forms of substrates where multiple positioning corrections are necessary.

The foregoing of specific embodiments of the present invention has been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practically application, to thereby enable others skilled in the art best to utilized the invention and various embodiments with various modifications as are suited to the particular use contemplated. It is intended that the scope of the invention be defined by the claims appended hereto and their equivalents.

What is claimed is:

1. A method of determining correctable parameters on a wafer stepper, the method employing a wafer stepper with a reticle, lens and stage movement parameters and comprising the steps of:

receiving a substrate in the wafer stepper;

printing a pattern of error-free alignment artifacts on the substrate;

printing a second pattern of alignment artifacts having predetermined errors on the substrate;

etching the first and second patterns of alignment artifacts into the substrate;

aligning a third pattern of alignment artifacts to the first or second pattern of alignment artifacts;

printing the third pattern of alignment artifacts onto the substrate; and measuring the resulting alignment of the third pattern to the lint and second patterns.

2. The method of claim 1 wherein, the printing of the second pattern of alignment artifacts has a predetermined offset selected to minimize round-off error for a wafer stepper having a defined incremental shift value.

3. The method of claim 1 wherein the predetermined errors are selected from at least one of the following: translation error, die magnification, die rotation, wafer magnification, and wafer rotation.

4. The method of claim 1 wherein the second pattern of alignment artifacts is printed with a predetermined offset.

5. The method of claim 4 wherein the predetermined offset is selected to minimize round-off error for a wafer stepper having a defined incremental shift value.

6. The method of claim 5 wherein the first and second patterns are printed from a center die of a test reticle through a predetermined location of the wafer stepper lens and stepped across the substrate.

7. The method of claim 6 wherein the predetermined location of the wafer stepper lens is at center.

* * * * *